United States Patent [19]

Keshtbod

[11] Patent Number: 4,608,585
[45] Date of Patent: Aug. 26, 1986

[54] ELECTRICALLY ERASABLE PROM CELL

[75] Inventor: Parviz Keshtbod, Los Altos, Calif.

[73] Assignee: Signetics Corporation, Sunnyvale, Calif.

[21] Appl. No.: 403,694

[22] Filed: Jul. 30, 1982

[51] Int. Cl.$^4$ .................. H01L 29/78; G11C 11/50
[52] U.S. Cl. ................................ 357/23.5; 357/54; 365/185
[58] Field of Search ................ 357/23 UT, 23.15, 54, 357/59, 41; 365/184, 185

[56] References Cited

U.S. PATENT DOCUMENTS

| | | | |
|---|---|---|---|
| 3,634,929 | 1/1972 | Yoshida et al. | 29/577 |
| 3,781,977 | 1/1974 | Hulmes | 29/584 |
| 4,087,795 | 5/1978 | Roessler | 365/185 |
| 4,150,389 | 4/1979 | Roessler | 357/23 |
| 4,203,158 | 5/1980 | Frohman-Bentchkowsky et al. | 365/185 |
| 4,209,849 | 6/1980 | Schrenk | 365/182 |
| 4,254,427 | 3/1981 | Lohstroh | 357/13 |
| 4,467,452 | 8/1984 | Saito et al. | 357/23 UT |

FOREIGN PATENT DOCUMENTS 2009507A 11/1978 United Kingdom .

OTHER PUBLICATIONS

IBM Technical Disclosure Bulletin, vol. 22, #1, Jun. 79, "Stacked Gate Device With Reduced O State Threshold Voltage", by Jambothan and Chang, p. 160.

Primary Examiner—Andrew J. James
Assistant Examiner—Mark Prenty
Attorney, Agent, or Firm—J. A. Dinardo; R. J. Meetin; R. T. Mayer

[57] ABSTRACT

In an EEPROM memory cell of the kind which relies on tunneling action through a thin oxide layer to store charge on a floating gate, the floating gate and the channel regions of the memory cell are provided with additional doping of the same kind as in the substrate in order to raise the virgin state threshold voltage of the memory cell to a high positive value, such as 4 volts. Additionally, the overlap area between the control gate and the floating gate is reduced to the extent that the capacitance between the floating gate and the control gate is substantially equal to the capacitance between the floating gate and the substrate during programming, but the effective capacitance between the floating gate and the substrate is greatly reduced during erase mode. As a result, little or no tunneling occurs during programming and the threshold voltage level is the same as the virgin threshold value of the memory cell. However, during erase, very efficient tunneling occurs from the floating gate to the substrate and the threshold voltage level decreases to a negative value. The difference between positive and negative values of the threshold voltage is comparable to that of conventional memory cells.

14 Claims, 3 Drawing Figures

ELECTRICALLY ERASABLE PROM CELL

BACKGROUND OF THE INVENTION

This invention relates to programmable memory devices of the kind that can be programmed as well as erased by electrical means, and particularly to improvements in such devices of the kind employing a floating gate MOS structure.

Metal-oxide-semiconductor (MOS) memory devices are known which are constructed with an electrically isolated floating gate between the control gate and the semiconductive body. By inducing a high enough electric field of the proper polarity between the floating gate and the semiconductive body, charge carriers can tunnel through a thin insulator from the semiconductive body to the floating gate to program the device to one binary state. By inducing an electric field of the opposite polarity between the floating gate and the semiconductive body, charge carriers can be removed from the floating gate to erase the data or cause the device to revert to its other binary state.

An electrically erasable programmable read-only memory (EEPROM) of the MOS kind employing a floating gate and a tunneling oxide is disclosed in U.S. Pat. No. 4,203,158. Since the floating gate in this type of device is electrically isolated from the outside, the programming and erase voltage is applied between the accessible control gate and the substrate, and the tunneling electric field is induced between the floating gate and the substrate through capacitive coupling. There are two capacitances associated with the floating gate. One is the capacitance between the floating gate and the substrate, and the other is the capacitance between the floating gate and the control gate. These two capacitances form a voltage divider across which the applied voltage divides inversely as the capacitances.

In order to provide effective tunneling action with reasonably low supply voltage in the neighborhood of 20 volts, the tunneling oxide between the floating gate and the substrate must be very thin, for example about 100 angstroms or less and about one-tenth the thickness of the oxide between the floating gate and the control gate. If the two gates were of the same area, most of the induced electric field would be developed across the thicker inter-gate oxide and very little electric field would appear across the tunneling oxide where it is needed. For effective tunneling action in the program mode, the overlap area between the control gate and the floating gate must be very large relative to the tunneling area. For the example given above, the overlap area must be about 15 times the area of the tunneling oxide. This large area requirement makes it rather difficult to fabricate high density EEPROMS that have a capacity of more than 16K bits and yet are not unduly bulky. There is a great need for a new EEPROM design of reduced physical size which also can be programmed and erased with relatively low voltages currently in use.

SUMMARY OF THE INVENTION

In accordance with the invention, a body of semiconductive material of first conductivity type is provided with first and second regions of second conductivity type that are spaced apart by a first channel region. A third region of second conductivity type is spaced apart in the body from the second region by a second channel region. A floating gate overlies both the first and second channel regions. A first insulating layer separates the floating gate from the first and second channel regions. The first insulating layer has a portion which overlies a part of the first channel region and which is thinner than the remainder thereof. The thin insulating layer portion constitutes a window through which charge tunneling can occur between the floating gate and the semiconductive body. A control gate overlies the floating gate and is separated from the floating gate by a second insulating layer that is thicker than the thin portion of the first insulating layer.

The first and second channel regions have an additional surface doping of first conductivity type and the floating gate has a doping of first conductivity type. For the n-channel case in which the first conductivity type is P type, these dopings together act to raise the virgin state threshold voltage of the first and second channel regions. The areas of the floating gate and the control gate and the thickness of the first and second insulating layers are so proportioned that when a programming voltage is applied between the control gate and the semiconductive body, an inversion layer is produced in the first channel region, thereby rendering the capacitance between the floating gate and the control gate substantially equal to the capacitance between the floating gate and the semiconductive body. The electric field thus produced across the thin insulating layer portion is not sufficient to produce any significant tunneling action therethrough to the floating gate, the floating gate voltage does not change, and the threshold voltage of the device does not change from the virgin state.

However, when an erase voltage of opposite polarity is applied between the control gate and the first region of second conductivity type, such as the drain region, there is no inversion layer produced in the first channel region and the capacitance between the floating gate and the semiconductive body is merely that which is limited to the small side diffused area of the drain region which is overlapped by the floating gate. The floating gate thus receives only a small proportion of the erase voltage, but a high voltage difference and high electric field is produced across the thin insulating layer. The high electric field is sufficient to produce tunneling from the floating gate to the drain region, thereby raising the floating gate to a more positive voltage and driving the threshold voltage to a negative value.

DETAILED DESCRIPTION OF THE PREFERRED EMBODIMENT

Figure 1:
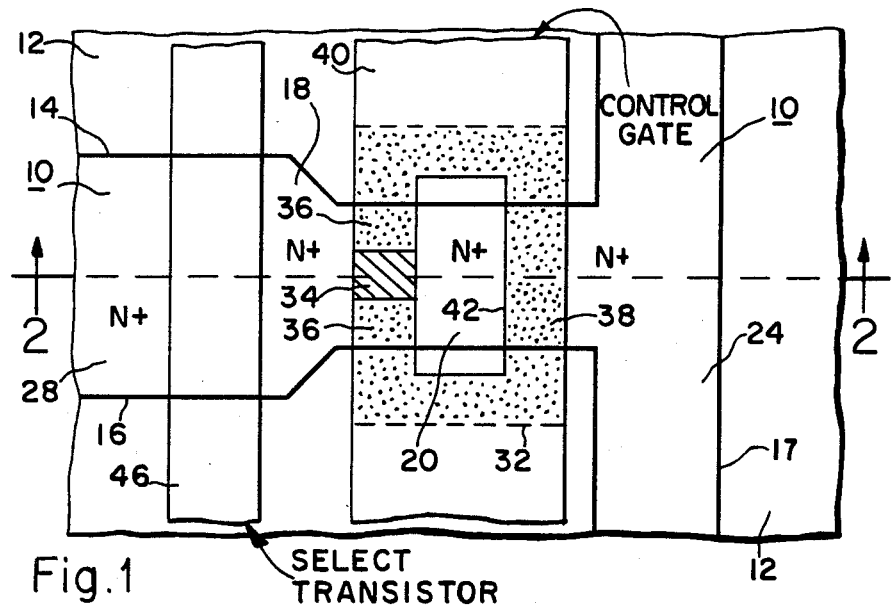
FIG. 1 is a top plan view of a memory cell constructed according to the invention.
Figure 2:
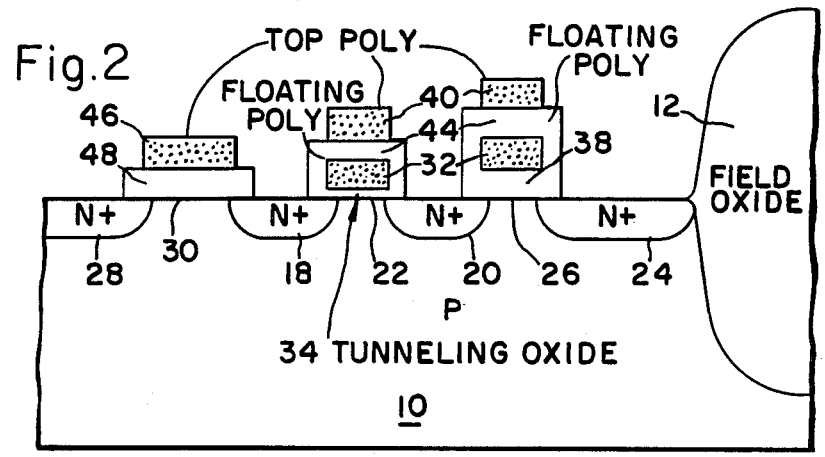
FIG. 2 is a sectional view of the memory cell taken through plane 2—2 in FIG. 1.

FIGS. 1 and 2 show a top plan view and a cross-sectional view, respectively, of an electrically erasable programmable read-only memory (EEPROM) cell constructed according to the invention. A semiconductive body or substrate 10 of monocrystalline semiconductive material, such as silicon, is provided with an active area 10 surrounded by areas of field oxide 12. The boundaries between the field oxide 12 and the active area 10 are denoted by heavy lines 14, 16 and 17. In the example shown, the cell is an n-channel device and so the substrate is shown as P-type, or first conductivity type. Within the top surface of the substrate 10 there are formed several laterally spaced regions of second conductivity type. A first region 18 of second conductivity type and a second region 20 of second conductivity type are spaced apart by a first channel region 22. A third region 24 of second conductivity type is spaced from the second region 20 by a second channel region 26. A fourth region 28 of second conductivity type is spaced from the first region 18 by a third channel region 30. All of the regions 18, 20, 24, 28 are heavily doped N-type conductivity regions, and as such are designated N+. The three channel regions 22, 26, 30 are aligned lengthwise.

A rectangularly annular floating gate 32 overlies both the first and second channel regions 22 and 26 respectively. The floating gate 32 is separated from a part of the first channel region 22 by a thin oxide region 34 and is separated from the remainder of the first channel region 22 by a thicker oxide layer 36. The thin oxide region 34 is 70 to 100 angstroms thick and the thicker oxide layer 36 is about 1000 angstroms thick. A thicker oxide layer 38 of the same thickness as the oxide layer 36 also separates the floating gate 32 from the second channel region 26. The annular floating gate 32 extends over the entire width of the first and second channel regions 22 and 26 and also extends partly over the field oxide 12, as shown in FIG. 1.

A control gate 40 overlies the floating gate 32 and has a rectangular opening 42 over the second region 20 coinciding with a similar opening in the floating gate 32. The control gate 40 extends vertically in both directions to other similar cells which are not shown. The control gate 40 is separated from the floating gate by an insulating layer 44, such as thermally grown silicon dioxide. The insulating layer 44 is approximately 800 angstroms thick.

A select gate 46 extends over the third channel region 30. The select gate 46 extends over the entire width of the third channel region 30 and also extends in both directions to other cells parallel to the control gate 40. The select gate 46 is separated from the third channel region 30 by an insulating layer 48, such as thermal silicon dioxide. The insulating layer 48 is about 700 angstroms thick. The select gate 46 and the N+ regions 18 and 28 separated by the third channel region 30 form a select transistor for selecting the memory cell. The N+ region 28 may be called the bit line, and the select gate 46 may also be called the select line or word line.

The control gate 40 and the select gate 46 may be made of polysilicon and doped N-type or P-type to render them conductive. The floating gate 32 is made of polysilicon and is doped P-type the same as the substrate 10, such as with boron. The first and second channel regions 22 and 26 also have an additional P-type doping of boron or the like, which may comprise an implant. The P-type doping of the channel regions 22 and 26 and of the floating gate 32 acts to raise the virgin state threshold voltage of the memory cell. The virgin state threshold voltage of the memory cell should be at least 3 or 4 volts positive. The virgin state threshold voltage VTO of the cell is the minimum voltage which can be applied to the control gate 40 to cause an inversion in the channel region 26, in the absence of charge on the floating gate 32 caused by tunneling. Channel region 22, of course, has a lower virgin state threshold because of the thin oxide region 34. However, the channel regions 22 and 26 must both be conductive for the cell to conduct. Since the channel region 26 requires a higher voltage on the gate 40 to become conductive than does the channel region 22, the virgin state threshold voltage of the cell is that of the channel region 26.

Typically, in the prior art devices exemplified by U.S. Pat. No. 4,203,158, the ratio of the capacitance between the floating gate and the control gate and the capacitance between the floating gate and the substrate is greater than 1, say 2.5. This is achieved by increasing the area of overlap between the control gate and the floating gate to about 30 times the area of the thin tunneling oxide. The virgin threshold may be 1 or 2 volts positive. Thus, if 20 volts positive is applied to the control gate to program the cell, the floating gate will receive 14 volts, which is substantially above the 10 volts required for tunneling through 100 angstroms of oxide. As a result, electrons will tunnel from the substrate to the floating gate so as to charge the floating gate negatively and thereby raise the threshold voltage of the memory cell to a value of about 7 volts positive, for example. Then, during the erase operation, an opposite polarity voltage is applied between the control gate and the substrate, and carriers tunnel back from the floating gate to the substrate, leaving the floating gate positively charged and reducing the threshold voltage to a negative value, say −5 volts, for example. In order to avoid the formation of a depletion layer under the thin oxide which would prevent tunneling back from the floating gate to the substrate, the prior art devices have an implant of arsenic or other N-type dopant underneath the thin tunneling oxide. This assists the tunneling effect during erase mode.

In contrast to the above, the present invention does not use an arsenic or N-type implant beneath the tunneling oxide, but instead adds an opposite type dopant, such as boron, which is of the same conductivity type as the substrate. Furthermore, the floating gate is also provided with a similar boron or P-type doping. The effect of these two measures is to raise the virgin state threshold voltage of the memory cell above that normally present in the prior art devices. Typically, the virgin state threshold voltage of the memory cell according to the invention is at least 3 volts and preferably about 4 volts. Also, the area of the overlap between the control gate and the floating gate, which also is the area of the interpoly oxide, is about one half of the one that is present in prior art devices, or about 15 times the area of the tunneling oxide. Accordingly, with the interpoly oxide being about 7.5 to 10 times the thickness of the thin tunneling oxide, the ratio of the relevant two capacitances is about one. That is, the capacitance between the floating gate and the control gate is about equal to the capacitance between the floating gate and the substrate.

Figure 3:
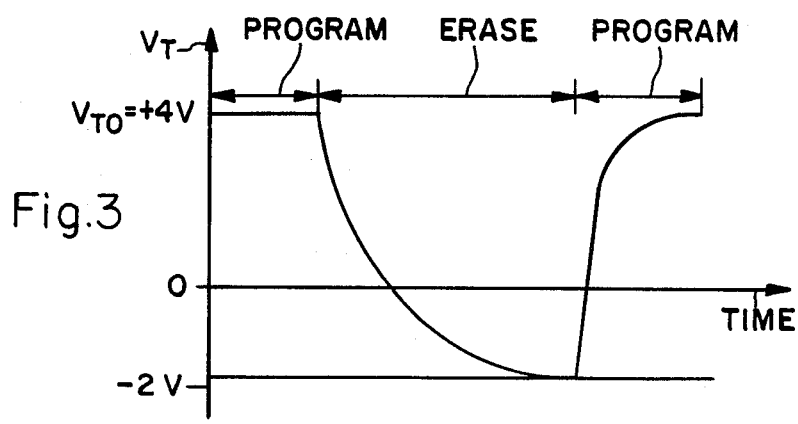
FIG. 3 is a graph showing the variation of memory cell threshold voltage as a function of time during program and erase modes.

The operation of the memory device of FIGS. 1 and 2 will now be described with the aid of the graph of FIG. 3. To program the memory device, a voltage of 20 volts positive is applied to the control gate 40 and the substrate 10 is grounded. Because the capacitance ratio is 1, only 10 volts will be induced on the floating gate 32. 10 volts on the floating gate 32 is sufficient to cause inversion in the first channel region 22 beneath the thin oxide layer 34 but it is not sufficient to cause any significant tunneling of electrons to the floating gate 32. The voltage of floating gate 32 will change little, if at all, and the threshold voltage of the memory device will remain the same, which is the virgin state threshold voltage of 4 volts, for example, assuming the state of the memory cell prior to programming was the virgin state. In FIG. 3, the threshold voltage $V_T$ during programming is shown as remaining flat at a value of 4 volts equal to the virgin threshold $V_{TO}$.

To erase the memory cell, 16 volts positive is applied to the drain region 18, and the control gate 40 is held at ground potential. Thus, a voltage of opposite polarity is applied during the erase mode. With 16 volts positive on the drain region 18, the channel region 22 will not experience inversion but instead will experience depletion. Since there is no inversion, the effective capacitance between the floating gate 32 and the substrate 10 is merely the capacitance between the floating gate 32 and the drain region 18, which is limited to the area of side diffusion of the N+ drain region 18 and is only about 0.3 micron wide. As a result, the capacitance ratio is very high. That is, the capacitance between the floating gate 32 and the control gate 40 is much higher than the capacitance between the floating gate 32 and the drain region 18. The voltage will divide so that most of it will be induced across the small capacitance between the floating gate 32 and the drain region 18. Only three volts positive or so will appear on the floating gate 32, making the voltage difference 13 volts, 13 volts is sufficient to produce effective tunneling action from the floating gate 32 to the drain region 18. Removing electrons from the floating gate 32 causes the potential on the floating gate 32 to rise positively and the threshold voltage to decrease or move in a negative direction. Thus in FIG. 3 the threshold voltage $V_T$ of the memory cell is seen to drop by 6 volts to minus 2 volts.

When it is time to reprogram the memory cell, the substrate 10 is grounded and the control gate voltage is again raised to 20 volts positive. The threshold voltage $V_T$ rises again to a level equal to the virgin state threshold value as before because $+3$ V worth of charge on the floating gate raises the floating gate voltage to $+13$ V which causes electron tunneling into the gate to cancel the positive charges in the floating gate.

By reducing the area of overlap between the control gate and the floating gate and thereby reducing the ratio of that overlap area relative to the area of the tunneling oxide compared to the prior art, the capacitance ratio is reduced to the extent that little or no tunneling action occurs during programming from the virgin. However, during erasing, the effective capacitance ratio is increased significantly compared to the prior art such reduced even further to an extent that an opposite polarity voltage applied between the substrate and the control gate causes very efficient tunneling action from the floating gate to the drain region 18. By suitably doping the channel regions and the floating gate to obtain a high virgin state threshold voltage, the threshold voltage window, which is the difference in threshold voltage between the value at programming and the value at erase, is maintained sufficiently high despite the absence of tunneling action during programming. The reduced area of overlap between the control gate and floating gate makes it possible to reduce the size of EEPROMS having capacity of 32K bits and higher.

What I claim is:

1. A memory device comprising:
    a body of semiconductive material of a first conductivity type;
    first and second regions of a second conductivity type opposite to the first conductivity type located in the body along its upper surface laterally spaced apart by a first channel region;
    a third region of the second conductivity type located in the body along the upper surface laterally spaced apart from the second region by a second channel region having a higher doping of the first conductivity type than underlying adjacent material of the body;
    an electrically conductive floating gate overlying the channel regions;
    a first electrically insulating layer separating the floating gate from the channel regions and having a portion which overlies part of the first channel region and is thinner than the remainder thereof;
    an electrically conductive control gate overlying the floating gate; and
    a second electrically insulating layer separating the control gate from the floating gate and being of greater thickness than the thin portion of the first insulating layer.

2. A device as in claim 1 wherein the floating gate overlies part of the first region of the second conductivity type at the thin portion of the first insulating layer.

3. A device as in claim 2 wherein programming and erasure are achieved by charge carrier tunneling at the thin portion of the first insulating layer.

4. A device as in claim 3 wherein the thickness of the thin portion of the first insulating layer is on the order of 100 angstroms.

5. A device as in claim 4 wherein the higher doping of the first conductivity type in the second channel region raises the absolute value of the virgin state threshold voltage of the second channel region to a level above that which would otherwise exist.

6. A device as in claim 2 wherein the floating gate comprises doped semiconductive material of the first conductivity type.

7. A device as in claim 6 wherein the first channel region has a higher doping of the first conductivity type than underlying adjacent material of the body.

8. A device as in claim 7 wherein programming and erasure are achieved by charge carrier tunneling at the thin portion of the first insulating layer.

9. A device as in claim 8 wherein the thickness of the thin portion of the first insulating layer is on the order of 100 angstroms.

10. A device as in claim 6 wherein the gates are annular in shape as viewed vertically with an opening over the second region of the second conductivity type.

11. A device as in claim 6 wherein the absolute value of the virgin state threshold voltage of the second channel region is 3-4 volts.

12. A device as in claim 6 wherein the effective capacitance between the floating gate and the body is much lower during erasure than during programming which is the opposite of erasure and which consists of at least attempting (a) to raise the threshold voltage of the second channel region where the first conductivity type is P type or (b) to lower the threshold voltage of the second channel region where the first conductivity type is N type.

13. A device as in claim 2 further including: a fourth region of the second conductivity type located in the body along the upper surface laterally spaced apart from the first region of the second conductivity type by a third channel region;
    an electrically conductive select gate overlying the third channel region; and
    a third electrically insulating layer separating the select gate from the third channel region.

14. A device as in claim 13 wherein the channel regions are aligned lengthwise.

* * * * *